United States Patent
Mori et al.

(10) Patent No.: US 11,251,033 B2
(45) Date of Patent: Feb. 15, 2022

(54) LIGHT IRRADIATION DEVICE AND FLASH LAMP

(71) Applicant: Ushio Denki Kabushiki Kaisha, Tokyo (JP)

(72) Inventors: Kazuyuki Mori, Tokyo (JP); Masahiko Kase, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 39 days.

(21) Appl. No.: 16/825,557

(22) Filed: Mar. 20, 2020

(65) Prior Publication Data
US 2020/0303178 A1 Sep. 24, 2020

(30) Foreign Application Priority Data
Mar. 21, 2019 (JP) .............................. JP2019-053952

(51) Int. Cl.
*H01J 61/54* (2006.01)
*H01J 61/02* (2006.01)

(52) U.S. Cl.
CPC .......... *H01J 61/547* (2013.01); *H01J 61/025* (2013.01)

(58) Field of Classification Search
CPC ........ H01J 61/547; H01J 61/025; H01J 61/32; H01J 61/35; H01J 61/90; H01J 61/80; H01J 61/04; H01J 61/36; H01L 21/67115
See application file for complete search history.

(56) References Cited

U.S. PATENT DOCUMENTS

| | | | |
|---|---|---|---|
| 2005/0168149 A1* | 8/2005 | Hiramoto | H01J 61/16 313/636 |
| 2009/0166351 A1 | 7/2009 | Yokomori | |
| 2014/0003800 A1* | 1/2014 | Ramamurthy | H01L 21/67115 392/416 |

FOREIGN PATENT DOCUMENTS

| | | | | |
|---|---|---|---|---|
| JP | 2009-164201 A | | 7/2009 | |
| JP | 2012248353 A | * | 12/2012 | .............. H01J 61/35 |

* cited by examiner

*Primary Examiner* — Donald L Raleigh
(74) *Attorney, Agent, or Firm* — Studebaker & Brackett PC (57) ABSTRACT

To provide a light irradiation device using a plurality of flash lamps in which a structure that can emit high intensity light as a whole and enables a flash lamp to be used for a practical lifetime without increasing an input current to each lamp is adopted. A light emission surface is provided on a distal end on a second electrode introducing part side of a light-emitting tube of a flash lamp including a first electrode introducing part and the second electrode introducing part, and a plurality of flash lamps are arranged in a standing manner on a top plate of a processing chamber so that the light emission surface faces the inside of the processing chamber.

21 Claims, 11 Drawing Sheets

LIGHT IRRADIATION DEVICE AND FLASH LAMP

BACKGROUND OF THE INVENTION

Field of the Invention

The present invention relates to a light irradiation device including a plurality of flash lamps and a flash lamp used for the same.

Description of the Related Art

In a semiconductor, impurities are ion doped into a silicon wafer and then annealing is performed, so that the impurities are activated and function as a semiconductor. As a heating means therefor, it is required to heat only the semiconductor surface doped with impurities for a short time of less than or equal to a microsecond (ms), where in a heating step, annealing using a flash lamp is very effective as disclosed in, for example, JP-A-2009-164201 (Patent Document 1).

In recent years, in the field of power semiconductors, semiconductor wafers made of silicon carbide (SiC) or gallium nitride (GaN) have begun to be used in addition to conventionally used silicon wafers, and these are regarded as promising in recent years due to many advantages such as high withstand voltage, high heat resistance, small loss, and the like.

However, since SiC and GaN have higher thermal conductivity than silicon, if flash lamp annealing is performed with the same energy as in the conventional art, heat is transferred from the surface to deeper regions, and the semiconductor wafer surface may not be heated to the desired temperature. Therefore, it is necessary to perform flash lamp annealing with larger energy than in the conventional art or to perform flash lamp annealing in a shorter time so that heat entering from the surface does not diffuse into the inside of the wafer.

However, if the amount of energy input to the flash lamp is increased, or if the same input energy is input in a short time, the peak value of the lamp current needs to be increased as a result. This causes a rise in the temperature of the inner surface of the lamp, which accelerates the deterioration of the light-emitting tube, and a problem that a predetermined lifetime cannot be completed arises.

PRIOR ART DOCUMENT

Patent Document
[Patent Document 1] JP-A-2009-164201

SUMMARY OF THE INVENTION

In view of the above problems of the related art, an object to be solved by the present invention is to provide a light irradiation device and a flash lamp capable of emitting high-intensity light.

In order to solve the above problems, a light irradiation device according to the present invention is a light irradiation device including a plurality of flash lamps, each including a long light-emitting tube enclosed with light-emitting gas, a first electrode introducing part provided on one end side of the light-emitting tube, a second electrode introducing part provided on the other end side, and a first electrode and a second electrode provided in each electrode introducing part; wherein a light emission surface is provided at a distal end on the second electrode introducing part side of the light-emitting tube of the flash lamp, and a plurality of flash lamps are adjacently provided in a standing manner on a top plate of the processing chamber so that the light emission surface faces an inside of the processing chamber.

Furthermore, at least the second electrode introducing part of the flash lamp is disposed so as to intersect a longitudinal axis of the light-emitting tube; and the light-emitting tubes of the adjacent flash lamps are arranged such that the longitudinal axes are inclined with respect to each other so that the interval on the first electrode introducing part side becomes wider than the interval on the light emission surface side.

Furthermore, the flash lamp is arranged so as to irradiate the irradiating object in the processing chamber with light without any gap.

The top plate of the processing chamber suitably has a dome shape.

Moreover, it is suitable that the second electrode introducing part is disposed to be located between the light-emitting tubes of the adjacent flash lamps.

Furthermore, the flash lamps are arranged concentrically so as to spread from a central region to a peripheral region of the top plate, and are arranged so that the number of lamps increases from the central region toward the peripheral region.

The flash lamp can be configured to be power controllable for each region of the central region and the peripheral region.

The flash lamp can be configured to be individually power controllable.

Moreover, it is suitable that a light irradiation window is provided on the top plate on which the flash lamp is arranged in correspondence with each light emission surface.

In order to solve the above problems, according to another aspect of the present invention, there is provided a flash lamp, which is used in the light irradiation device, including a long light-emitting tube enclosed with light-emitting gas, a first electrode introducing part provided on one end side of the light-emitting tube, a second electrode introducing part provided on the other end side, and a first electrode and a second electrode provided in each electrode introducing part; where a light emission surface is provided at a distal end on the second electrode introducing part side of the light-emitting tube of the flash lamp; at least the second electrode introducing part is arranged to intersect a longitudinal axis of the light-emitting tube; and a tip of the second electrode is arranged to project into the light-emitting tube.

The second electrode is suitably an anode.

Furthermore, the first electrode introducing part may be formed to extend in an identical axial direction with the light-emitting tube.

Moreover, a projection area of the second electrode in the longitudinal direction of the light-emitting tube is formed to be smaller than a maximum projection area of the second electrode in a direction orthogonal to the longitudinal direction of the light-emitting tube.

The second electrode may have a flat shape extending along a longitudinal direction of the light-emitting tube.

Furthermore, the second electrode may have a shape in which a through hole is provided along the longitudinal direction of the light-emitting tube.

It is preferable that a chip portion is formed on an outer surface of the light-emitting tube; and the chip portion is arranged to face the second electrode introducing part.

Moreover, a reflective film can be formed on a tube wall of the light-emitting tube along the longitudinal direction thereof.

In addition, it is suitable that a trigger member is provided on an outer peripheral surface of the light-emitting tube along a longitudinal direction thereof; and the trigger member is disposed on a side opposite to a side on which the second electrode introducing part is disposed.

Furthermore, in order to solve the problems described above, there is suitably provided a light irradiation unit including a plurality of flash lamps, each including a long light-emitting tube enclosed with light-emitting gas, a first electrode introducing part provided on one end side of the light-emitting tube, a second electrode introducing part provided on the other end side, and a first electrode and a second electrode provided in each electrode introducing part; where a light emission surface is provided at a distal end on the other end side of the light-emitting tube of the flash lamp; the flash lamp is provided in plurals, and each flash lamp is adjacently provided so that the respective light emission surface faces the same region side.

Furthermore, suitably, at least the second electrode introducing part of the flash lamp is disposed so as to intersect a longitudinal axis of the light-emitting tube; and the light-emitting tubes of the adjacent flash lamps are arranged such that the longitudinal axes are inclined with respect to each other so that the interval on the first electrode introducing part side becomes wider than the interval on the light emission surface side.

The light-emitting tube of the flash lamp is suitably disposed on a substrate.

Furthermore, the flash lamp is suitably arranged so as to irradiate the processing object with light without any gap.

It is suitable that the flash lamps are arranged concentrically, and are arranged so that the number of lamps increases from a central region toward a peripheral region.

According to the present invention, the flash lamp is configured to extract high intensity light from the end face in the longitudinal axis direction of the light-emitting tube and use such light. That is, there is provided a light irradiation device using a flash lamp including a long light-emitting tube enclosed with light-emitting gas, a first electrode introducing part provided on one end side of the light-emitting tube, a second electrode introducing part provided on the other end side, and a first electrode and a second electrode provided in each electrode introducing part; where light can be emitted from the distal end faces of the large number of flash lamps, as well as high intensity light can be emitted as a whole without increasing the input current to the individual flash lamp, and the flash lamp can be used for a practical lifetime.

Furthermore, there is provided a light irradiation device in which a plurality of flash lamps are adjacently mounted in a processing chamber, the light-emitting tube of the flash lamp includes a first electrode introducing part and a second electrode introducing part, a light emission surface is provided at the distal end on the second electrode introducing part side, the second electrode introducing part is disposed to intersect the longitudinal direction of the light-emitting tube, the light-emitting tubes of the adjacent flash lamps are disposed on the top plate of the processing chamber with the longitudinal axes inclined with respect to each other so that the interval on the first electrode introducing part side becomes wider than the interval on the light emission surface side, the light can be emitted from the distal end faces of the large number of flash lamps, high intensity light can be emitted as a whole without increasing the input current to the individual flash lamp, and the flash lamp can be used for a practical lifetime.

Moreover, in the flash lamp including the first electrode introducing part provided on one end side of the light-emitting tube and the second electrode introducing part provided on the other end side, the light emission surface is provided at the distal end on the second electrode introducing part side of the light-emitting tube, the second electrode introducing part is arranged to intersect the longitudinal axis of the light-emitting tube, high intensity light can be extracted from the end face of the light-emitting tube in the longitudinal direction and used and the tip of the second electrode can be arranged to project into the light-emitting tube, so that arc does not come into contact with the inner wall of the light-emitting tube at the periphery of the second electrode when discharge occurs between the first electrode and the second electrode and the lifespan of the light-emitting tube can be extended.

DETAILED DESCRIPTION OF THE PREFERRED EMBODIMENTS

Figure 1:
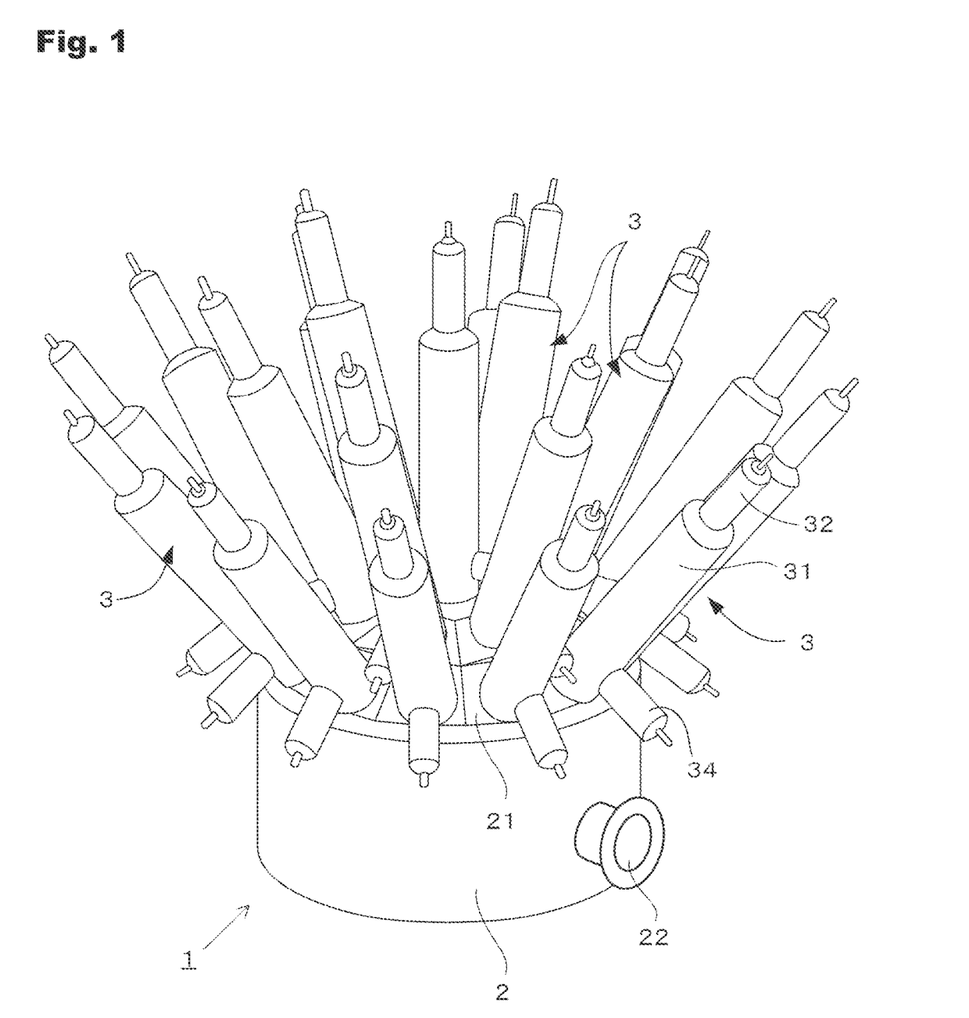
FIG. 1 is a perspective view of an outer appearance of a light irradiation device according to the present invention.

FIG. 1 is a perspective view of an outer appearance of a light irradiation device 1 according to the present invention as viewed from the upper surface, the light irradiation device 1 including a processing chamber 2 in which an irradiating object is accommodated and a plurality of flash lamps 3 radially provided in a standing manner on a top plate 21. The flash lamp 3 includes a first electrode introducing part 32 on one end side of a light-emitting tube 31 and a second electrode introducing part 34 on the other end side, and is mounted on the top plate 21 of the processing chamber 2 on the second electrode introducing part 34 side.

Note that an exhaust pipe 22 is provided in the processing chamber 2 to vacuum and exhaust the inside of the processing chamber 2 using the exhaust pipe 22.

Figure 2:
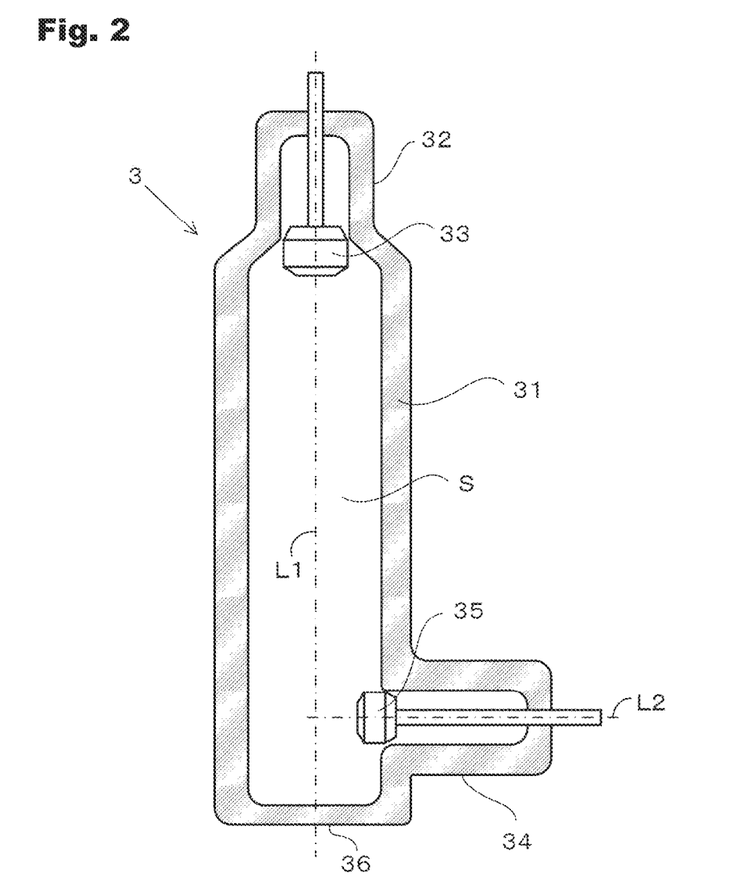
FIG. 2 is a cross-sectional view of a flash lamp used in the light irradiation device of the present invention.

FIG. 2 shows a schematic structure of the flash lamp 3 used in the light irradiation device 1 of the present invention. The flash lamp 3 includes a long cylindrical light-emitting tube 31, where the first electrode introducing part 32 extending in the same tube axis direction as the light-emitting tube 31 is provided at one end, and a first electrode 33 is provided in the inside thereof.

On the other hand, the second electrode introducing part 34 is provided on the other end side of the light-emitting tube 31 so as to intersect with a longitudinal axis L1 of the light-emitting tube 31, a second electrode 35 is provided therein and is arranged such that a distal end face faces or projects into a discharge space S in the light-emitting tube 31. With this arrangement, the second electrode 35 has an arrangement relationship in which the direction of an axis L2 intersects the longitudinal axis L1 of the light-emitting tube 31.

As described above, the distal end face of the second electrode 35 faces or projects into the discharge space S of the light-emitting tube 31, so that the arc caused by the discharge between the first electrode 33 and the second electrode 35 does not come into contact with the glass of the light-emitting tube 31 and the second electrode introducing part 34 at the periphery of the second electrode 35 and the deterioration thereof is suppressed.

As for the arrangement in which the second electrode introducing part 34 intersects the light-emitting tube 31, as shown in FIG. 2, typically, the second electrode introducing part 34 is generally arranged to be orthogonal to the light-emitting tube 31, but this is of course not the sole case.

However, it is required that the axis L2 of the second electrode 35 provided in the second electrode introducing part 34 be provided so as to intersect the longitudinal axis L1 of the light-emitting tube 31.

A light emission surface 36 is formed at the distal end of the light-emitting tube 31 on the second electrode introducing part 34 side, and light generated by the light-emitting gas enclosed in the light-emitting tube 31 is emitted through the light emission surface 36.

The enclosed light-emitting gas is, for example, xenon gas, and generates light having a wavelength of 200 to 1100 nm.

Furthermore, in the first electrode 33 and the second electrode 35, the second electrode 35 is suitably used as an anode. In this type of flash lamp, the size of the anode can be made smaller than that of the cathode, and by using the second electrode 35 located on the light emission surface 36 side as the anode, a disadvantage that flash generated in the discharge space S is shielded by the electrode and cannot be effectively used can be minimized as much as possible.

Figure 3:
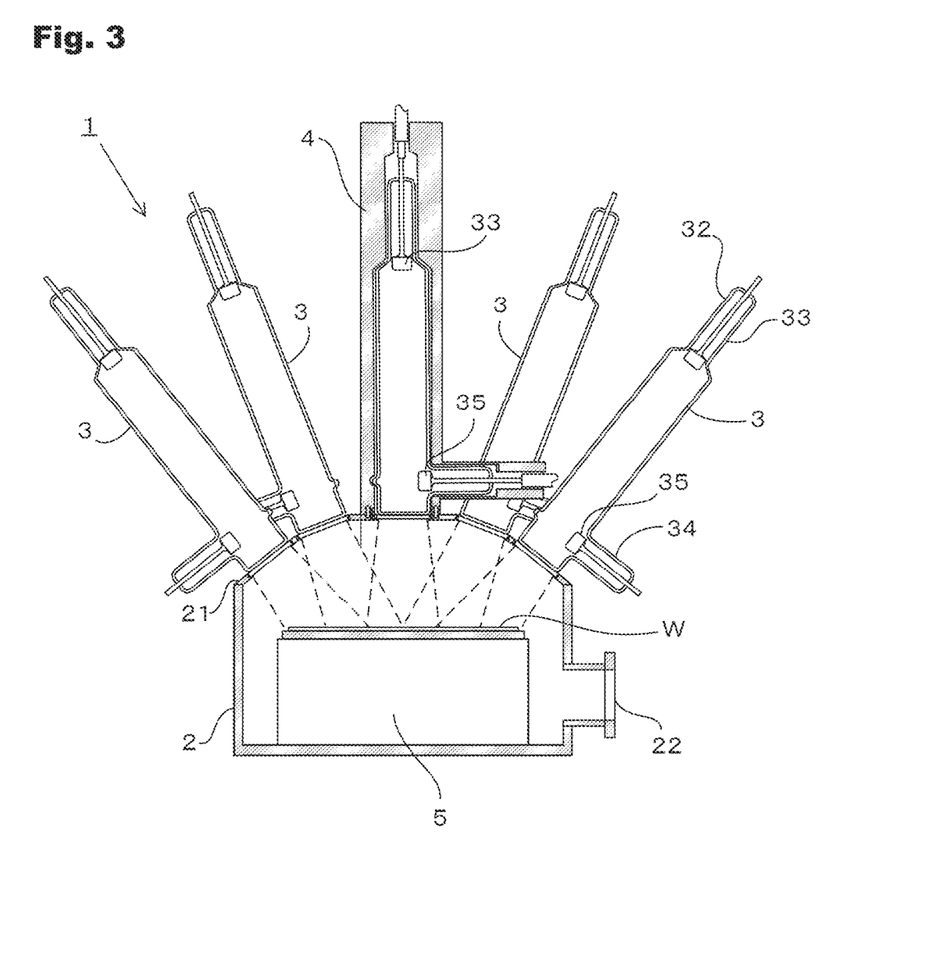
FIG. 3 is a cross-sectional view of FIG. 1.
Figure 4:
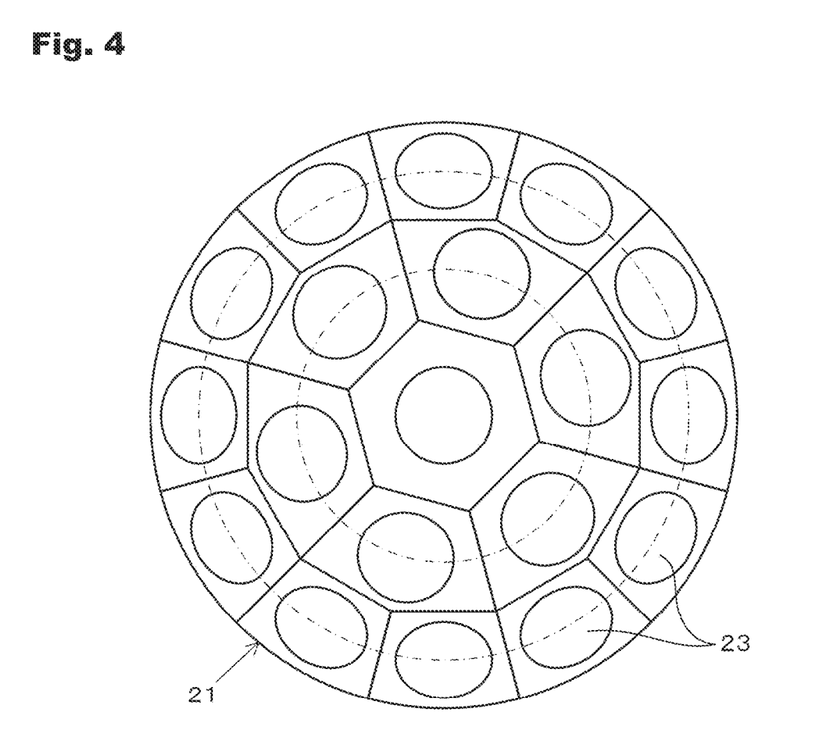
FIG. 4 is a top view of a top plate.

FIG. 3 shows a cross-sectional view of the entire light irradiation device 1 of the present invention, where the processing chamber 2 has a dome-shaped top plate 21. As shown in FIG. 4, a large number of light irradiation windows 23 are concentrically arranged on the top plate 21 so as to spread from the central region to the peripheral region of the top plate 21, so that the number of the light irradiation windows 23 increases from the central region toward the peripheral region.

In FIG. 3, each flash lamp 3 is stood on the top plate 21 such that the light emission surface 36 at the tip of the light-emitting tube 31 corresponds to the light irradiation window 23 of the top plate 21 of the processing chamber 2.

Therefore, the installing number of flash lamps 3 arranged on the top plate 21 increases from the central region toward the peripheral region.

At this time, the light-emitting tubes 31 of the adjacent flash lamps 3 are arranged with the longitudinal axes inclined with respect to each other such that the interval on the first electrode introducing part 32 side becomes wider than the interval on the light emission surface 36 side (second electrode introducing part 34 side), and the second electrode introducing part 34 extending to intersect with the longitudinal axis of the light-emitting tube 31 is located to extend between the light-emitting tubes 31 of the adjacent flash lamps 3 and arranged so as not to interfere with the light-emitting tube 31 of another flash lamp 3.

Such an arrangement can be easily obtained by forming the top plate 21 into a dome shape.

As shown in FIG. 3, the mounting of the flash lamp 3 to the processing chamber 2 is performed by, for example, a holder 4 fitted on the flash lamp 3.

Figure 5:
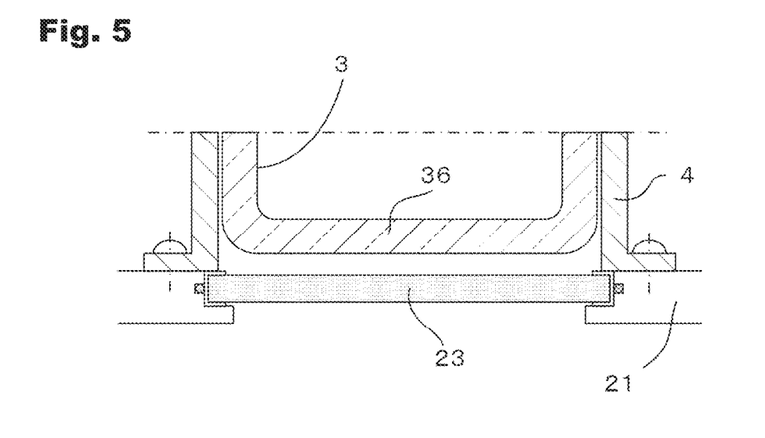
FIG. 5 is a mounting structural view of the flash lamp to the top plate.

FIG. 5 shows an example of a specific mounting structure for mounting the holder 4 interiorly holding the flash lamp 3 to the top plate 21. The top plate 21 is provided with the light irradiation window 23 shown in FIG. 4, and by screwing the holder 4 to the top plate 21 at a position corresponding to the light irradiation window 23, the flash lamp 3 held in the holder 4 can be arranged at a position where the light emission surface 36 corresponds to the light irradiation window 23.

At this time, the light irradiation window 23 is air-tightly attached to the top plate 21 to have the inside of the processing chamber 2 in a vacuum state.

The mounting of the flash lamp 3 to the top plate 21 is not limited to this example, and any means can be used.

Furthermore, in FIG. 3, the holder 4 is shown as being fitted to only one flash lamp 3 for the purpose of avoiding complication, but is to be fitted to a plurality of flash lamps 3.

Such a holder 4 requires insulation properties for an applied voltage of up to about 3000V with respect to the flash lamp, heat resistance properties to withstand a maximum of several hundred degrees (up to 300° C.), and light resistance properties to withstand radiated light from the flash lamp are required, and as a material that satisfies these requirements, it is suitable to use machinable ceramics (ceramics excelling in machinability) such as Macor (registered trademark) manufactured by Corning Inc. and Photoveil (registered trademark) manufactured by Ferrotec Ceramics Co.

Figure 6:
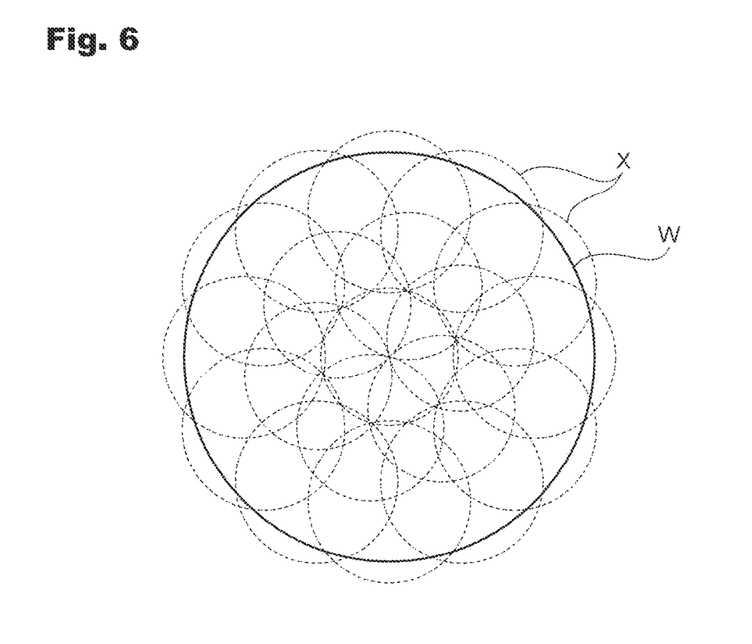
FIG. 6 shows an irradiation range from a flash lamp in an irradiating object.

Referring again to FIG. 3, a mounting table 5 on which the irradiating object W is mounted is disposed in the processing chamber 2, and light from a plurality of flash lamps 3 mounted on the processing chamber 2 is irradiated without any gap so that a part of the irradiation range X from the single flash lamp 3 overlaps each other on the irradiating object W, as shown in FIG. 6.

As shown in FIGS. 1 and 4, in the large number of concentrically arranged flash lamps 3, the number of installed lamps increases from the central region toward the peripheral region, so that light output in the peripheral region where the temperature of the irradiating object W is less likely to rise can be increased.

The flash lamp 3 can be configured such that power control can be performed for each of the central region and the peripheral region. Thus, the light emission range can be set as the area control (zone control), and a desired heating step can be realized.

In another example, the flash lamps 3 can be configured to be individually power-controllable, and in such a case, more accurate light output control can be performed.

Figure 7:
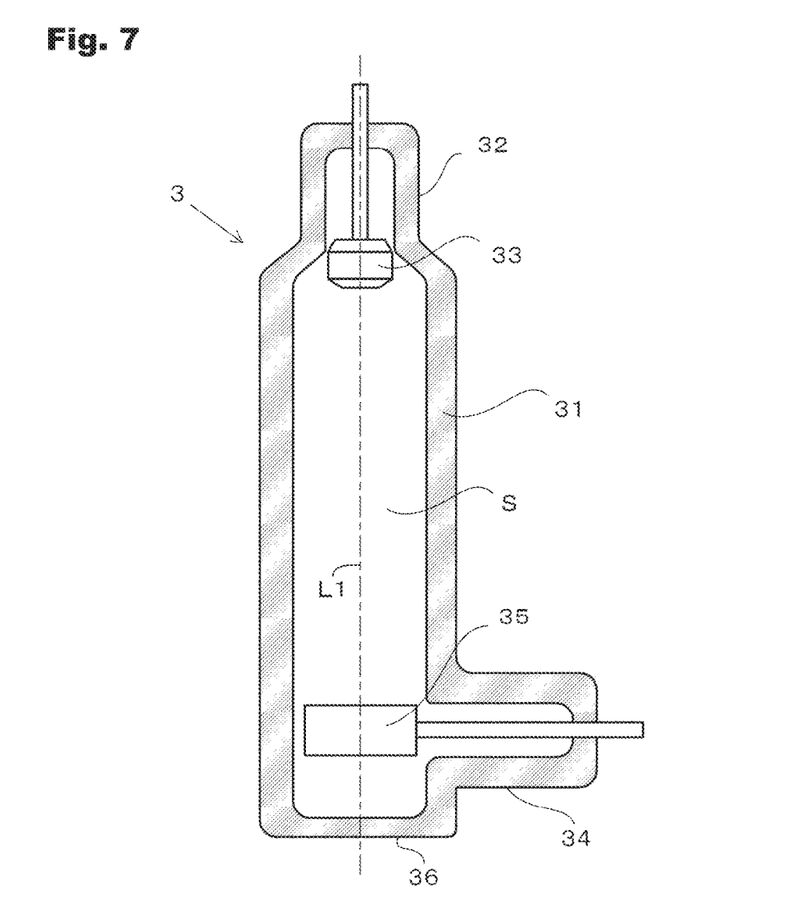
FIG. 7 is a cross-sectional view of a second example of the flash lamp.

FIG. 7 shows another example of the flash lamp 3, and a mode in which the second electrode 35 is further projected out in the discharge space S is shown, where by way of example, the tip of the second electrode 35 may be projected out up to a region across the central axis L1 of the light-emitting tube 31, or the tip of the second electrode 35 may be present entirely in the discharge space S. In such a configuration, the electrode shape needs to be appropriately adjusted so that the flash generated in the discharge space S is not shielded by the second electrode 35 as much as possible.

For example, the electrode shape is desirably adjusted so that the projection area of the second electrode 35 in the tube axis direction L1 of the light-emitting tube 31 becomes smaller than the maximum projection area of the second electrode 35 in a direction orthogonal to the tube axis direction.

This is because it is necessary to reduce the projection area of the second electrode 35 in the tube axis direction of the light-emitting tube 31 so that the flash generated from the discharge space S is not shielded by the second electrode 35, and it is necessary to design the projection area of the second electrode 35 in a direction orthogonal to the tube axis direction to be large so that the heat capacity of the second electrode 35 is not excessively reduced from the standpoint of waste heat.

Figure 8A:
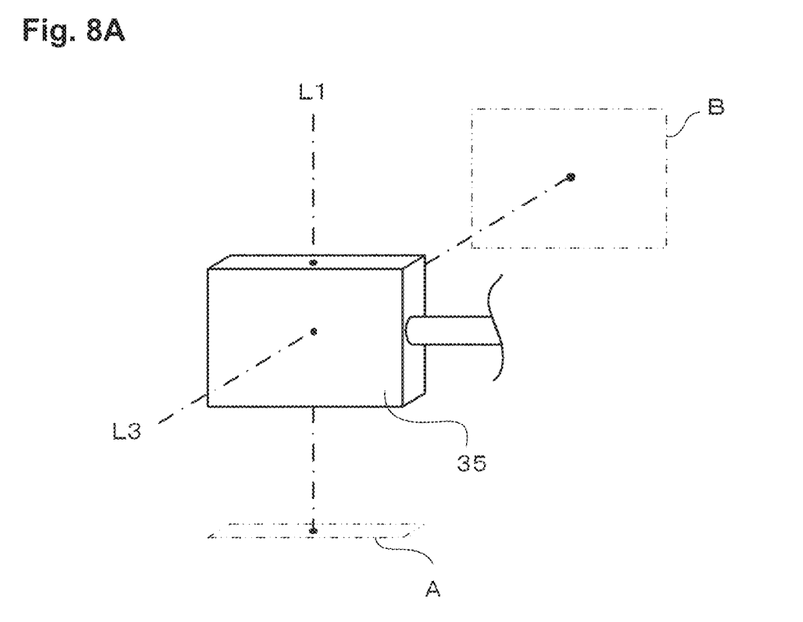
FIGS. 8A and 8B are mode examples of a second electrode of the flash lamp.
Figure 8B:
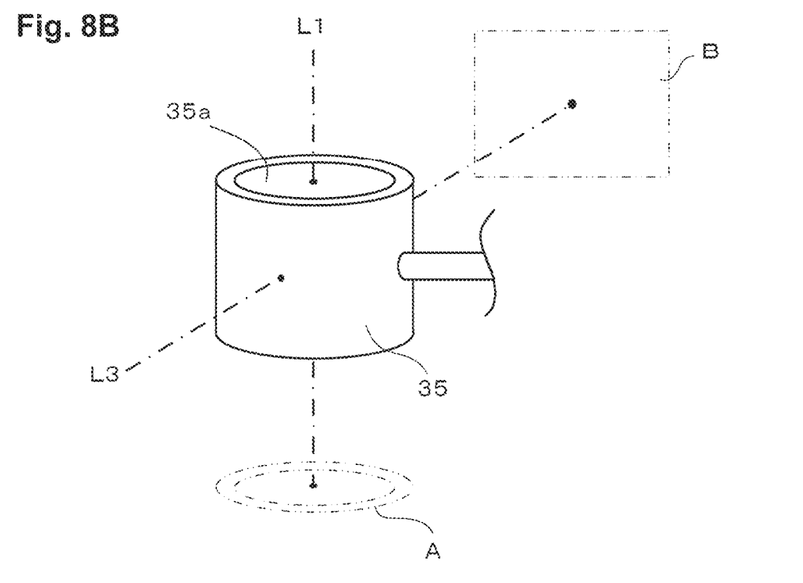

FIGS. 8A and 8B show two specific examples of the second electrode 35 formed with such considerations.

The second electrode 35 shown in FIG. 8A has a flat shape along the tube axis (longitudinal axis) L1 direction of the light-emitting tube 31. Thus, the projection area A of the second electrode 35 in the tube axis direction L1 of the light-emitting tube 31 can be made smaller than the maximum projection area B in the axis direction L3 orthogonal to the tube axis direction.

In the second electrode 35 shown in FIG. 8B, a through hole 35a is formed along the tube axis direction (longitudinal axis) of the light-emitting tube 31. In this example, the second electrode 35 has a ring shape. This also allows the projection area A of the second electrode 35 in the tube axis direction L1 to be smaller than the maximum projection area B in the axis direction L3 orthogonal to the tube axis direction. Furthermore, the light extraction from the discharge space S can be satisfactorily carried out by forming the through holes 35a, and a more uniform light irradiation can be realized.

Thus, the second electrode 35 is desirably designed so that the projection area A in the tube axis direction L1 is smaller, and for example, is preferably designed to be less than or equal to 80%, more preferably designed to be less than or equal to 50%, and still more preferably designed to be less than or equal to 30% of the maximum projection area B in the axis direction L3 orthogonal to the tube axis direction.

Figure 9:
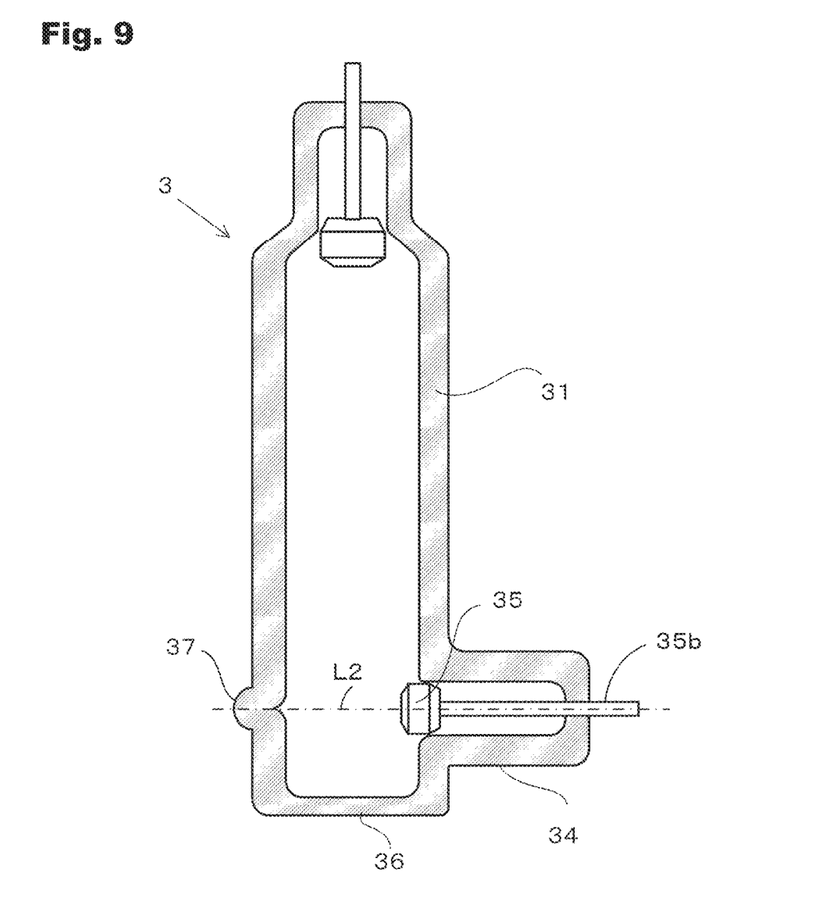
FIG. 9 is a cross-sectional view of a third example of the flash lamp.

FIG. 9 shows another example of the flash lamp of the present invention, in which a chip portion (also referred to as an exhaust pipe remaining part) 37 is formed on the outer surface of the light-emitting tube 31 and the chip portion 37 is formed at a position on an opposite side facing to the second electrode introducing part 34. That is, the chip portion 37 is formed ahead of the second electrode 35 in the tube axis direction L2.

Normally, in a step of sealing the electrode shaft, a sealing portion (sealing portion of the electrode shaft and the glass) is heat-welded to realize air-tight sealing. In order to realize more accurate heat-welding, it is usually desirable to heat-weld the sealing portion while rotating with respect to the gas burner.

However, in the flash lamp 3 of the present invention, since the second electrode introducing part 34 is configured to extend in a direction intersecting the light-emitting tube 31, if attempt is made to rotate the flash lamp 3 around the second electrode introducing part 34 in the electrode sealing step described above, the rotation axis is shifted due to the presence of the light-emitting tube 31 and precise heat-welding may become difficult to perform.

Therefore, when an exhaust pipe (which is later melted and sealed and remains as a chip portion 37) is connected in a direction along the axial direction of the second electrode introducing part 34, and the electrode shaft 35b of the second electrode 35 is sealed while rotating the second electrode introducing part 34, the second electrode introducing part 34 can be rotated while being supported by the exhaust pipe 37, and the sealing step can be realized without causing a rotation axis shift during the rotation. Thereafter, the exhaust pipe is removed in the chip-off step, and as a result, the chip portion 37 is formed in a region facing the second electrode introducing part 34.

In view of the above, a configuration in which the chip portion 37 is disposed in a region facing the second electrode introducing part 34 is desirable.

Figure 10:
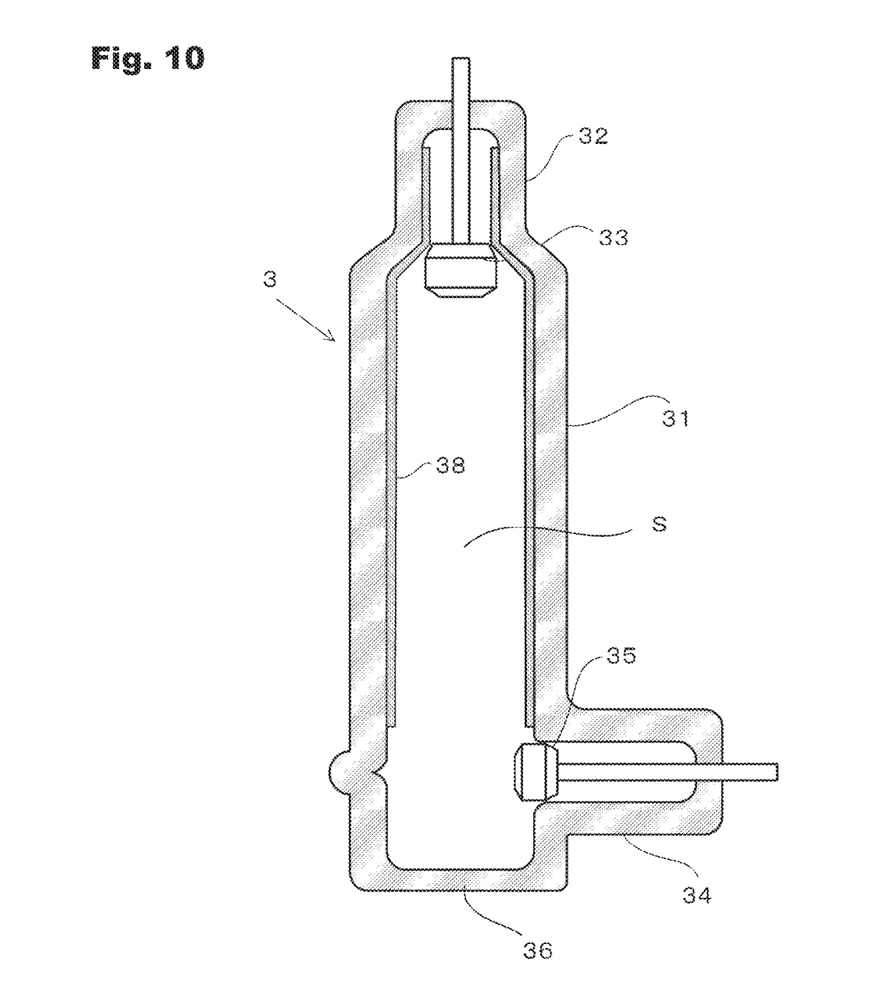
FIG. 10 is a cross-sectional view of a fourth example of the flash lamp.

FIG. 10 shows another example of the flash lamp 3, where in this example, a reflective film 38 is formed on the inner peripheral surface of the light-emitting tube 31 along the longitudinal axis direction. Thus, the flash generated in the discharge space S is reflected by the reflective film 38 and is emitted from the light emission surface 36 formed at the distal end of the light-emitting tube 31, so that the amount of emitted light can be increased.

The reflective film 38 is desirably formed so as to cover the periphery of the first electrode 33. Thus, the proportion of the light generated in the discharge space S leaking from the first electrode introducing part 32 side is greatly reduced, and the light usage efficiency can be improved.

As such a reflective film 38, a material having a characteristic of reflecting light in the ultraviolet region generated in the discharge space S is suitable, and for example, a reflective film made of silica or alumina can be adopted. This is because SiC, GaN, and the like have a large light absorption amount in the ultraviolet region of 400 nm or less and can be very effective to heating.

Figure 11:
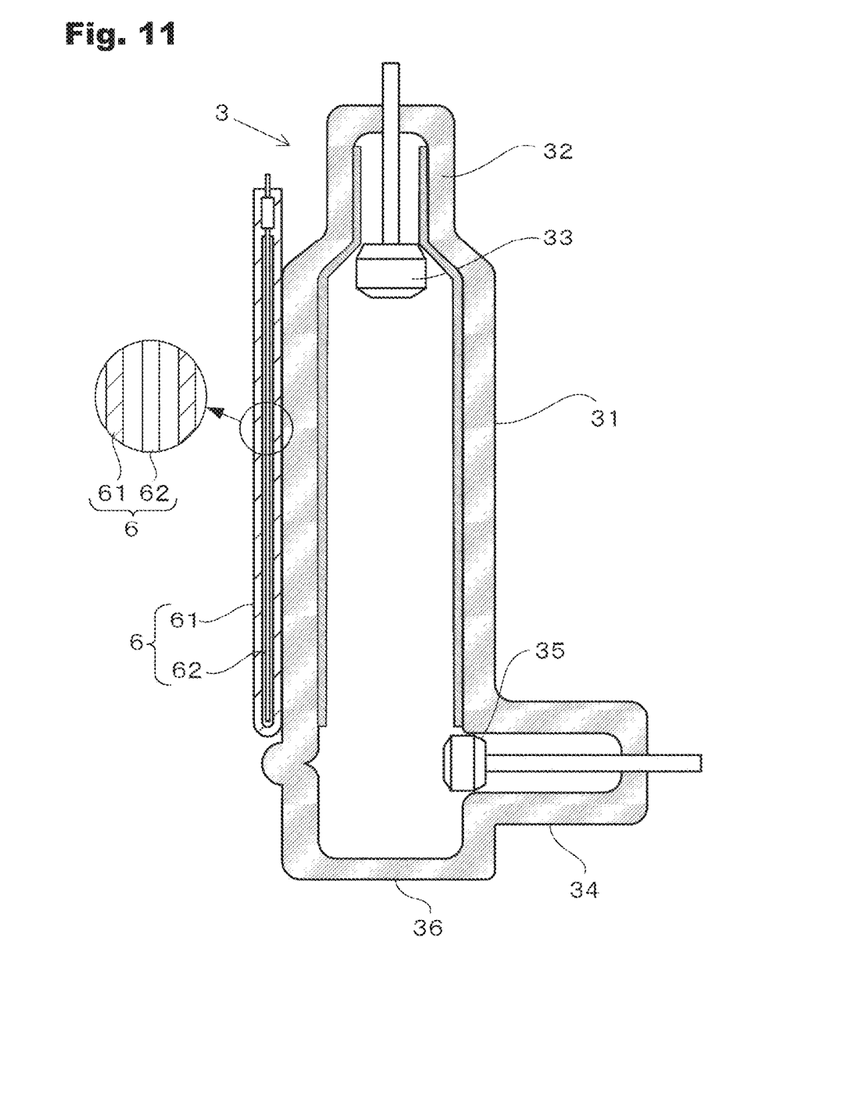
FIG. 11 is a cross-sectional view of a fifth example of the flash lamp.

FIG. 11 shows still another example of the flash lamp 3, where in this example, a trigger member 6 is provided on the outer peripheral surface of the light-emitting tube 31 along the longitudinal direction. The trigger member 6 includes a sealed trigger tube 61 and a trigger wire 62 made of a metal material disposed inside the trigger tube. The inside of the trigger tube 61 may be vacuum drawn or rare gas may be enclosed therein.

The trigger member 6 is arranged on the side opposite to the side on which the second electrode introducing part 34 is arranged. Since the discharge by the trigger member 6 occurs along the trigger member 6 inside the light-emitting tube 3, the first electrode is preferably arranged at a position facing the second electrode 35 in the sense of inducing a discharge between the first electrode 33 and the second electrode 35.

Figure 12:
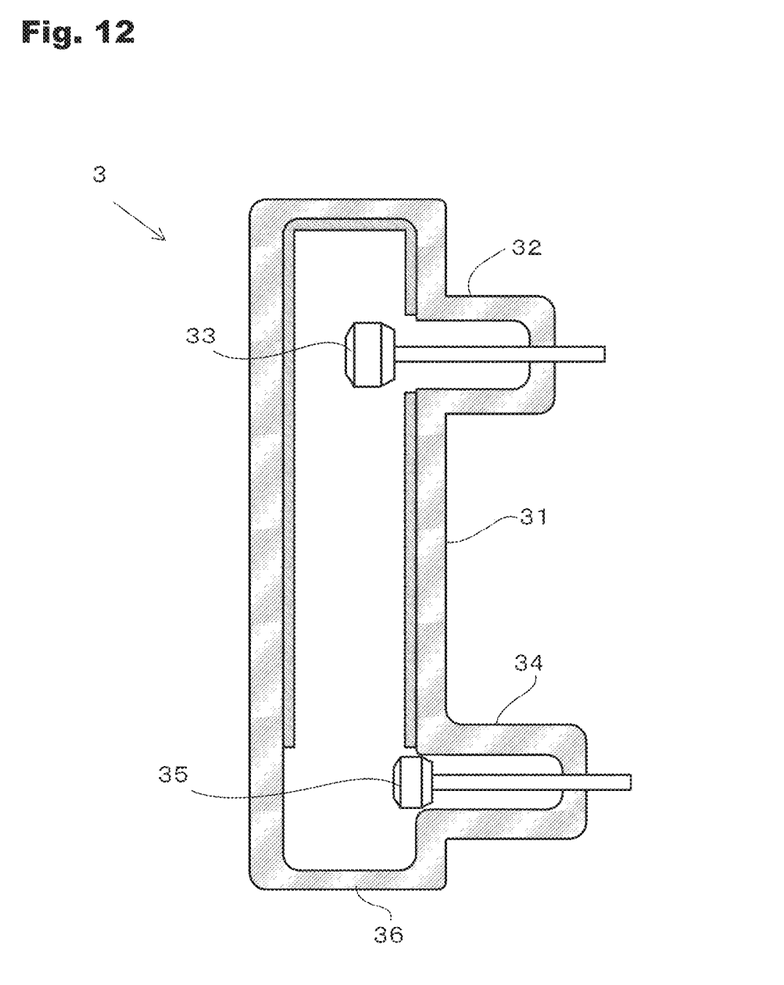
FIG. 12 is a cross-sectional view of a sixth example of the flash lamp.

In each of the examples described above, the first electrode introducing part 32 is shown as extending in the same tube axis direction as the light-emitting tube 31, but is not limited to this, and as shown in FIG. 12, the first electrode introducing part 32 may be provided so as to intersect the longitudinal axis of the light-emitting tube 31, similar to the second electrode introducing part 34. In this case, naturally, the first electrode 33 also extends in a direction intersecting the light-emitting tube 31.

The first electrode introducing part 32 and the second electrode introducing part 34 do not necessarily need to be arranged in the same direction with respect to the light-emitting tube 31.

Furthermore, as an example according to the present invention, a configuration example of a light irradiation unit including a large number of the flash lamps can be considered. Specifically describing, the light irradiation unit includes a plurality of flash lamps, the flash lamp including a long light-emitting tube enclosed with light-emitting gas, a first electrode introducing part provided on one end side of the light-emitting tube, a second electrode introducing part provided on the other end side, and a first electrode and a second electrode provided in each of the electrode introducing parts. As an example, a light emission surface is provided at the distal end of the light-emitting tube of the flash lamp on the second electrode introducing part side, and each flash lamp is provided in a standing manner on a substrate and arranged so that the light emission surface of each flash lamp faces the substrate side. Similarly to the shape of the top plate, the shape of the substrate is not limited to a flat plate and may be a concave shape or a dome shape, and various shapes can be adopted.

Furthermore, the light-emitting tube of each flash lamp preferably has a configuration of being provided in a standing manner with the longitudinal axes inclined with respect to each other such that the interval on the first electrode introducing part side becomes wider than the interval on the light emission surface side. Moreover, with the arrangement in which each light emission surface faces the same region side, light emitted from each light emission surface is applied onto a processing object arranged in an arbitrary region and high-intensity light can be emitted as a whole.

As described above, in the light irradiation device including the flash lamp according to the present invention, a plurality of flash lamps are adjacently provided in a standing manner on a top plate of a processing chamber so that the light emission surface at the tip of the flash lamp faces the processing chamber, at least the second electrode introducing part of the first electrode introducing part and the second electrode introducing part provided in the flash lamp is arranged to intersect the longitudinal axis of the light-emitting tube, and the light-emitting tubes of the adjacent flash lamps are arranged with the longitudinal axes inclined with respect to each other such that the interval on the first electrode introducing part side becomes wider than the interval on the light emission surface side, whereby a plurality of flash lamps can be arranged in the processing chamber without interfering with each other, light can be emitted from the distal end faces of the large number of flash lamps, high intensity light can be emitted as a whole without increasing the input current to the individual flash lamp, and the flash lamp can be used for a practical lifetime.

What is claimed is:

1. A light irradiation device comprising a plurality of flash lamps, each including a long light-emitting tube enclosed with light-emitting gas, a first electrode introducing part provided on one end side of the light-emitting tube, a second electrode introducing part provided on the other end side, and a first electrode and a second electrode provided in each electrode introducing part;
   wherein a light emission surface is provided at a distal end on the second electrode introducing part side of the light-emitting tube of the flash lamp, and the large number of flash lamps are adjacently provided in a standing manner on a top plate of the processing chamber so that the light emission surface faces an inside of the processing chamber;
   at least the second electrode introducing part of the flash lamp is disposed so as to intersect a longitudinal axis of the light-emitting tube; and
   the light-emitting tubes of the adjacent flash lamps are arranged such that the longitudinal axes are inclined with respect to each other so that the interval on the first electrode introducing part side becomes wider than the interval on the light emission surface side.

2. The light irradiation device according to claim 1, wherein the flash lamp is arranged to irradiate a processing object in the processing chamber with light without any gap.

3. The light irradiation device according to claim 1, wherein the top plate of the processing chamber has a dome shape.

4. The light irradiation device according to claim 1, wherein the second electrode introducing part is disposed to be located between the light-emitting tubes of the adjacent flash lamps.

5. The light irradiation device according to claim 1, wherein the flash lamps are arranged concentrically so as to spread from a central region to a peripheral region of the top plate, and are arranged so that the number of lamps increases from the central region toward the peripheral region.

6. The light irradiation device according to claim 5, wherein the flash lamp is configured to be power controllable for each region of the central region and the peripheral region.

7. The light irradiation device according to claim 1, wherein the flash lamps are configured to be individually power controllable.

8. The light irradiation device according to claim 1, wherein the top plate on which the flash lamp is disposed includes a light irradiation window in correspondence with each light emission surface.

9. A flash lamp comprising a long cylindrical light-emitting tube enclosed with light-emitting gas, a first electrode introducing part consisting of a tube connected to one end side of the light-emitting tube, a second electrode introducing part consisting of a tube connected to the other end side, and a first electrode and a second electrode provided in each electrode introducing part;
   wherein a light emission surface is provided at a distal end on the second electrode introducing part side of the light-emitting tube of the flash lamp;
   at least the second electrode introducing part is arranged to intersect a longitudinal axis of the light-emitting tube; and
   a tip of the second electrode is arranged to protrude further inward than an inner wall of the cylindrical light-emitting tube.

10. The flash lamp according to claim 9, wherein the second electrode is an anode.

11. The flash lamp according to claim 9, wherein the first electrode introducing part is formed to extend in an identical axial direction with the light-emitting tube.

12. The flash lamp according to claim 9, wherein a projection area of the second electrode in the longitudinal direction of the light-emitting tube is formed to be smaller than a maximum projection area of the second electrode in a direction orthogonal to the longitudinal direction of the light-emitting tube.

13. The flash lamp according to claim 12, wherein the second electrode has a flat shape along the longitudinal direction of light-emitting tube.

14. The flash lamp according to claim 12, wherein the second electrode is provided with a through hole extending along the longitudinal direction of the light-emitting tube.

15. The flash lamp according to claim 9, wherein
   a chip portion is formed on an outer surface of the light-emitting tube; and
   the chip portion is arranged to face the second electrode introducing part.

16. The flash lamp according to claim 9, wherein a reflective film is formed on an inner peripheral surface of the light-emitting tube along a longitudinal direction thereof.

17. The flash lamp according to claim 9, wherein
a trigger member is provided on an outer peripheral surface of the light-emitting tube along a longitudinal direction thereof; and
the trigger member is disposed on a side opposite to a side on which the second electrode introducing part is disposed.

18. A light irradiation unit comprising a plurality of flash lamps, each including a long light-emitting tube enclosed with light-emitting gas, a first electrode introducing part provided on one end side of the light-emitting tube, a second electrode introducing part provided on the other end side, and a first electrode and a second electrode provided in each electrode introducing part;
wherein a light emission surface is provided at a distal end on the other end side of the light-emitting tube of the flash lamp; and
the light-emitting tubes of the adjacent flash lamps are arranged such that the longitudinal axes are inclined with respect to each other so that the interval on the first electrode introducing part side becomes wider than the interval on the light emission surface side.

19. The light irradiation unit according to claim 18, wherein the light-emitting tube of the flash lamp is arranged on a substrate.

20. The light irradiation unit according to claim 18, wherein the flash lamp is arranged to irradiate a processing object with light without any gap.

21. The light irradiation unit according to claim 18, wherein the flash lamps are arranged concentrically, and are arranged so that the number of lamps increases from a central region toward a peripheral region.

* * * * *